(12) United States Patent
Lahr et al.

(10) Patent No.: US 7,106,068 B2
(45) Date of Patent: *Sep. 12, 2006

(54) EXTERIOR LAMP CHECK FOR MOTOR VEHICLES

(75) Inventors: Jeremy A. Lahr, Columbia City, IN (US); Allyson K. Kreft, Fort Wayine, IN (US); Douglas R. Taylor, Fort Wayne, IN (US); Steve F. Wagester, Fort Wayne, IN (US); Marilyn R. Miars, LaOtto, IN (US)

(73) Assignee: International Truck Inteellectual Property Company, LLC, Warrenville, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/048,598

(22) Filed: Feb. 1, 2005

(65) Prior Publication Data

US 2006/0170427 A1 Aug. 3, 2006

(51) Int. Cl.
*G01R 31/00* (2006.01)
(52) U.S. Cl. ..................................... 324/504
(58) Field of Classification Search ............... 324/503, 324/504, 73.1, 406, 408; 340/932.2
See application file for complete search history.

(56) References Cited

U.S. PATENT DOCUMENTS

| 4,866,390 | A  | * | 9/1989  | Butchko      | 324/504  |
|-----------|----|---|---------|--------------|----------|
| 5,355,119 | A  | * | 10/1994 | Pearlman     | 340/468  |
| 5,499,009 | A  | * | 3/1996  | Davis        | 340/468  |
| 6,066,951 | A  | * | 5/2000  | Maass        | 324/414  |
| 6,087,932 | A  | * | 7/2000  | Belgard      | 340/468  |
| 6,674,288 | B1 | * | 1/2004  | Gumbel et al.| 324/504  |
| 2002/0190847 | A1 | * | 12/2002 | Armstrong | 340/425.5 |
| 2003/0057955 | A1 | * | 3/2003  | Gumbel et al.| 324/504 |

\* cited by examiner

*Primary Examiner*—Hezron Williams
*Assistant Examiner*—Ryan Christensen
(74) *Attorney, Agent, or Firm*—Dennis K. Sullivan

(57) ABSTRACT

An automated system for cycling vehicle lamps on and off allows direct inspection by one person of operability of the lamp bulbs while doing a walk around of the vehicle. The system is switch operated. Interlocks to operation are based upon the status of the vehicle's service brake, its park brake and the on/off status of the lights themselves. Lights are organized by related groups and each group given a distinctive, repeating cycle to lighten the burden of memorization on the operator.

7 Claims, 5 Drawing Sheets

EXTERIOR LAMP CHECK FOR MOTOR VEHICLES

BACKGROUND OF THE INVENTION

1. Technical Field

The present invention relates generally to commercial motor vehicles and more particularly to an automated system for cycling vehicle lamps on and off to allow direct sight inspection by one person of operability of the lamp bulbs during a vehicle walkaround.

2. Description of the Problem

Federal regulations governing commercial vehicles and school busses provide for periodic inspection of various vehicle systems. Among the vehicle systems requiring inspection are exterior lamps, such as headlights, turn indicator lamps and identification lights. An inspection must determine not only if the lamp is operable, but that systems for actuating lamps for indicating turns, braking, or for flashing, are also functioning correctly. Performing such checks has generally been much easier if two people are available to make the check, one to remain in the cab of the vehicle to depress the brakes, activate turn signals and perform other similar operations while another person walks around the vehicle to view the lamps' operation. Where only one person, typically the driver, is available, such checks can be quite onerous.

Partial automation of a exterior light inspection procedure was proposed in U.S. Pat. No. 6,674,288, which is incorporated herein by reference. The Vehicle Lamp Inspection System proposed there provided for the automatic activation and deactivation of a vehicle's exterior lights in accordance with a predetermined sequence. The system was implemented over a programmable electrical system controller, programmed to implement a repeating test program in response to a user request.

SUMMARY OF THE INVENTION

According to the invention there is provided a vehicle lamp exercise feature. The lamp exercise feature provides cycling on and off of a plurality of lamps mounted to be visible on the exterior of the vehicle. The lamps are organized into functional subsets of lamps. An electrical system controller has a plurality of lamp energization output ports with an energization circuit for each functional subset of lamps, each energization circuit being connected to a different one of the lamp energization outputs. A first set of lamp activation switches for some of the functional subsets of lamps, and service brake position and parking brake position switches, are connected to the electrical system controller to provide status inputs to the electrical system controller. A gauge controller provides input points for a second set of lamp activation switches, including a lamp test switch. An ignition switch position sensing element provides a further a control input to the gauge controller. A datalink between the gauge controller and the electrical system controller allows indications of the state of status and control inputs received by the gauge controller to be communicated to the electrical system controller. The electrical system controller further includes a programmable microcomputer for switching on and off each of the plurality of energization output ports. A test program executable on the programmable microcomputer is responsive to actuation of the lamp test switch for execution. The test program includes program means for grouping selected functional subsets of lamps. The test program further provides means for sequentially activating and extinguishing the lamps of each functional subset within a group undergoing testing by selective energization of the lamp energization output ports. Further program means are responsive to detection that the park brake is set, the ignition switch position is on and all exterior lamp energization output ports are off to allow the test program to proceed upon detection of activation of the exterior lamp check switch. Still further program means provide for detecting a change in state of one of the brake position switch, the park brake position switch, or a lamp activation switch for terminating execution of the test program.

Additional effects, features and advantages will be apparent in the written description that follows.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
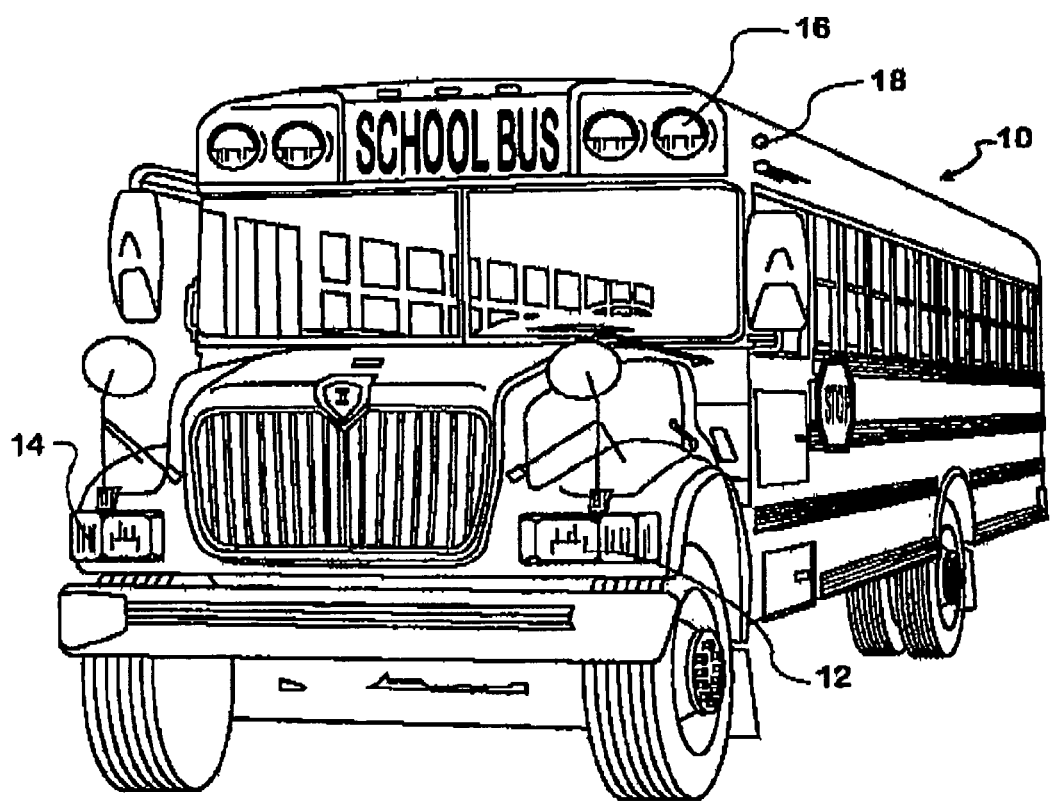
FIG. 1 is a perspective view of a school bus equipped with lighting systems with which the present invention is advantageously employed.

Referring to the drawings and in particular referring to FIG. 1 a school bus 10 is shown. An assortment of lamps are mounted to or to be visible on the exterior of school bus 10, including, but not limited to headlamps 12, front turn signals 14, front flashers 16 and side marker lights 18.

Figure 2:
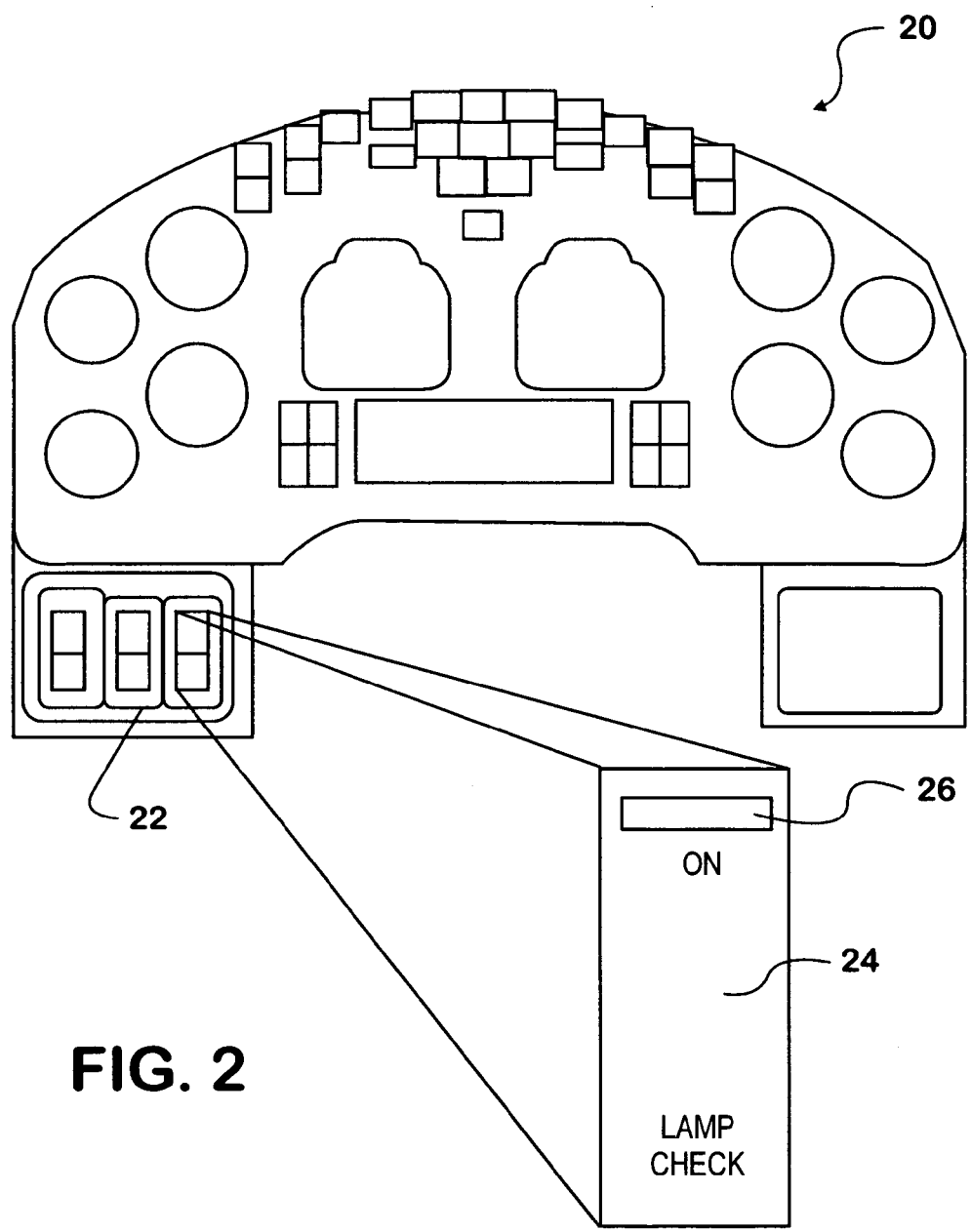
FIG. 2 is a simplified front elevation of a bus instrument panel.

Referring to FIG. 2, an instrument panel 20 is positioned at a driver's station in the interior of school bus 10. Execution of the lamp check routine of the present invention is initiated, in part, by cycling of a switch 24 mounted in a switch array 22 at the lower left portion of the panel 20. A lamp 26 set in the switch 24 is illuminated to indicate when the program of the present invention is executing or a request for execution has been made.

Figure 3:
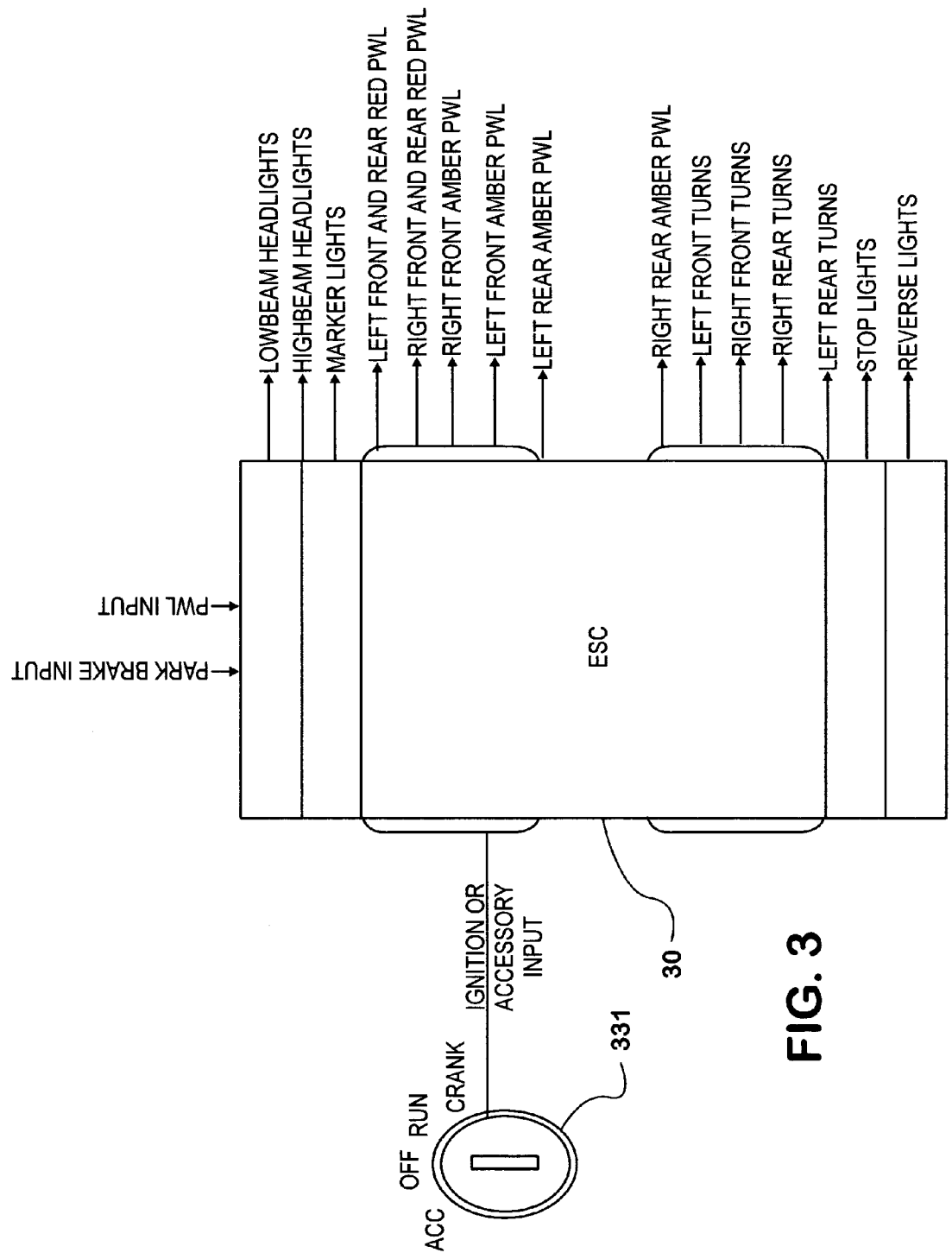
FIG. 3 is a high level schematic of the lighting connections for an electrical system controller.

FIG. 3 illustrates lighting pin connections for a programmable electrical system controller (ESC) 30 and selected input connections. ESC 30 is a high level controller for an vehicle controller area network. ESC 30 directly energizes most vehicle exterior lamps including, by group: the low-beam headlights; the highbeam headlights; the marker lights; the left front and rear red pupil warning lights (PWL); the right front and rear red PWL; the right front amber PWL; the left front amber PWL; the left rear amber PWL; the right rear amber PWL; the left front turn signals; the right front turn signals; the right rear turn signals; the left rear turn signals; the stop lights; and, the reverse lights. ESC 30 is connected to receive directly a park brake position signal input and the PWL input from a resistor switching network.

ESC 30 receives an ignition input signal from an ignition switch 331 over a controller area network bus.

Figure 4:
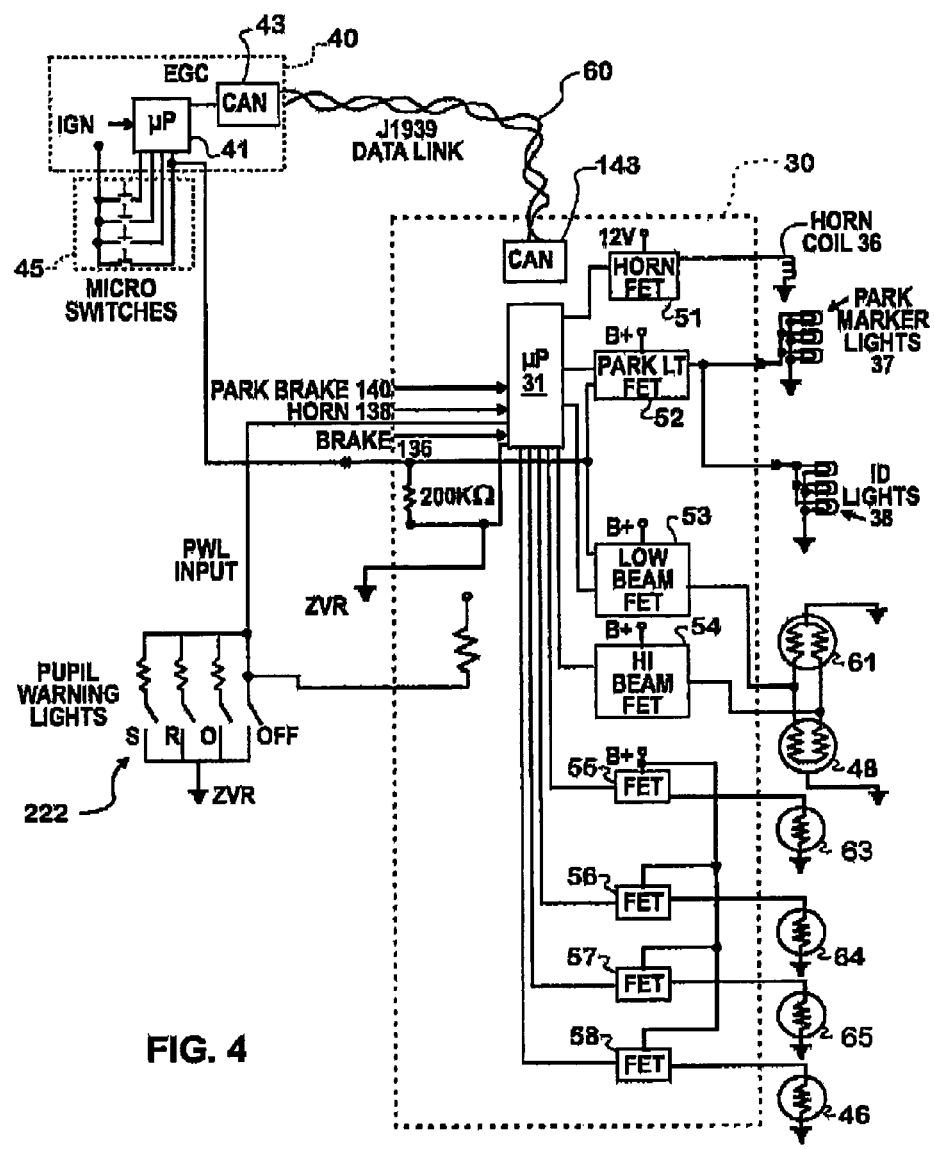
FIG. 4 is a circuit schematic for a motor vehicle lighting system and related controls.

FIG. 4 is a partial circuit schematic of an electrical gauge controller (EGC) 40, ESC 30, and some of the plurality of lamps energized under the control of the ESC. Several power switching Field Effect Transistors (FETs) used for energizing various lamps are illustrated. Fewer than the number of FETs required are illustrated because the specific circuit element is simply repeated up to the number of lamp circuits for which support is required. ESC 30 is a programmable body systems computer used to control many vehicle electrical system functions, most of which are not shown. In the past, many of these functions were controlled by switches, relays and other independently wired and powered devices. ESC 30 is based on a microprocessor 31 which executes programs and which controls switching of the plurality of power FETs 52, 53, 54, 55, 56, 57 and 58 used to actuate vehicle exterior lights. Among those lights, and explicitly illustrated here are a park and marker light circuit 37 and an ID light circuit 38, which are energized by Park Light FET 52 and the low and high beam headlights 61, 48, which are energized by FETs 53 and 54, respectively. Yet another power FET 51 is used to energize a horn coil 36. One FET may be used to drive the indicator light 26 in the exterior light test switch 24. This allows indicator light 26 to flash during testing, and other certain other conditions.

Microprocessor 31 can apply activation signals to all of the lamps subject to inspection as well as to a horn coil 36. In the case of headlights 61, 48 this may also involve pulling high a headlight enable line by instruction to EGC 40. Microprocessor 31 is connected to provide an activation signal to a horn power FET 51 which in turn drives a horn coil 36. Another signal line from microprocessor 31 is connected to drive a park light FET 52 which in turn drives park/marker light bulbs 37 and license plate ID bulbs 38. Yet another signal line from microprocessor 31 drives a low beam FET 53, which in turn drives filaments in headlight bulbs 48. Low beam FET 53 and park light FET 52 further require an Input on the headlight enable line to operate. Still another pin on microprocessor 31 controls a high beam FET 54 which drives high beam filaments in bulbs 61 and 48. Remaining pins on microprocessor 31 are used to control the remaining lights of the vehicle. Four FETs 55, 56, 57 and 58 are illustrated as connected to receive the signals and, in turn, to power bulbs 63, 64, 65, and 46. However, those skilled in the art will realize now that any number of FETs and bulbs may be connected. Flasher operation may also be readily simulated.

Inputs to ESC 30 come from various sources. Primary among these is the electric gauge controller (EGC) 40, which provides local control and a controller area network interface over the instruments and switches installed on instrument panel 20. EGC 40 communicates with ESC 30 over a CAN data link (bus 60) which conforms to the SAE J1939 standard. CAN controllers 43 and 143 located with EGC 40 and ESC 30, respectively, implement the network protocols and data packet decoding. EGC 40 is based on a microprocessor 41 but includes only limited and typically fixed programming. EGC 40 handles an array of microswitches 45, and is programmed to provide manual control over headlights, park lights, marker lights, etc., as well as provide for initiation of the test cycles of the present invention, using the microswitches. Sources of direct inputs to ESC 30, relevant to the operation of the present invention, include a park brake 140, brake 136, possible horn 138 and a pupil warning light resistive network 222. The resistor network 222 is adapted from switches supplied to implement a speed control system. Naturally, other arrangements may be made for turning on the PWL.

Activation of a lamp test routine begins with cycling of one of the switches in microswitch array 45, with is detected by EGC 40 and broadcast over bus 60 for detection by ESC 30. Microprocessor 31 then begins sequences of actuation of the FET switches to illuminate the various lamps in accordance with predetermined routines. The test routine also requires, as a precondition, that the park brake 140 be set, all lights being checked are off, and the ignition key is in the 'ON' position. Cancellation of the cycle occurs upon anyone of the following: (1) tapping or depressing the brake pedal 136; (2) release of the park brake 140; (3) moving the ignition key to the start or off positions; or (4) turning on any of the lights that are in the sequence. The preconditions force the vehicle to be immobilized before the sequence can begin.

Figure 5:
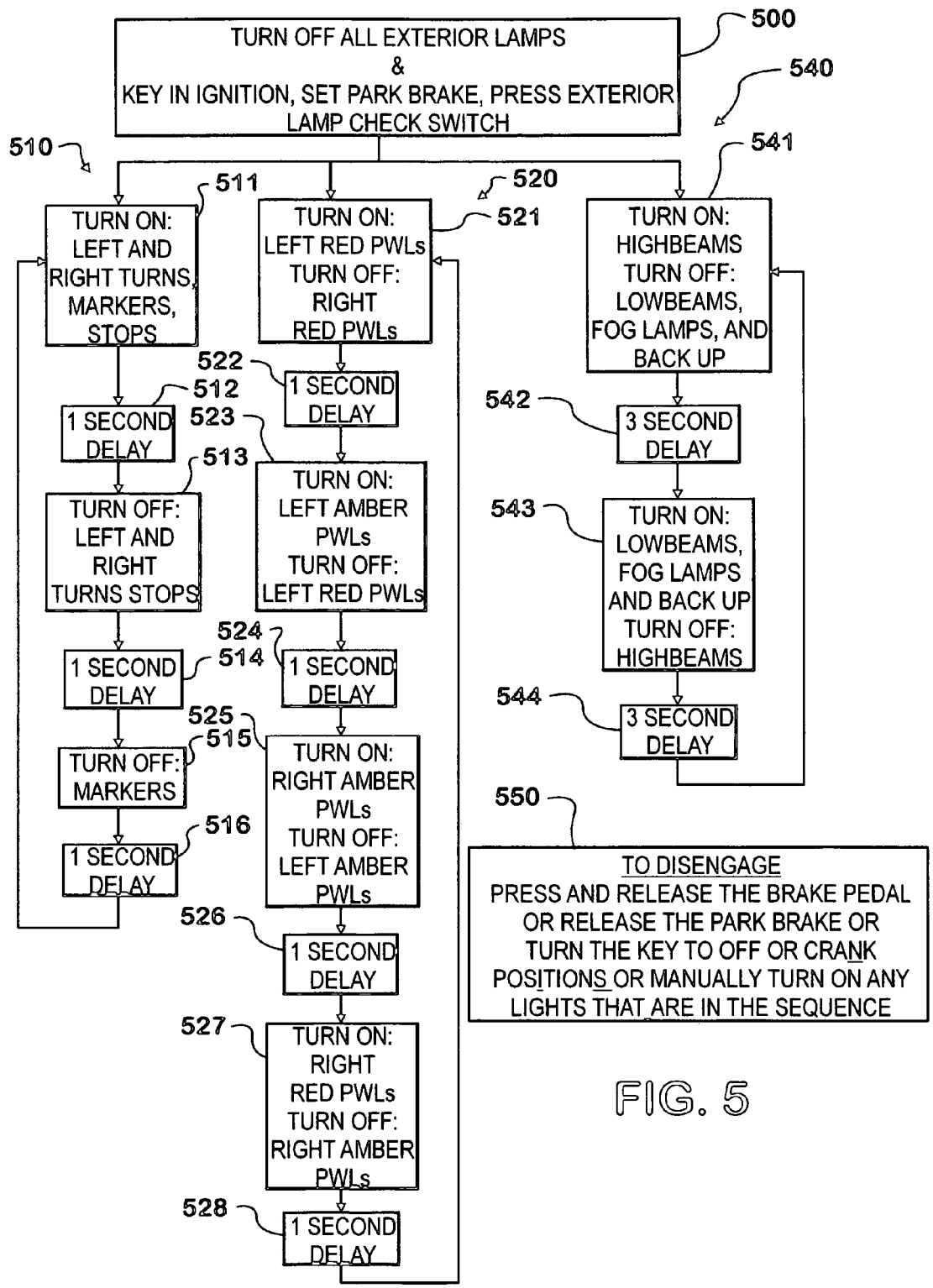
FIG. 5 is a flow chart of a program executed on the electrical system controller for implementing the invention.

FIG. 5 is a high level flow chart which illustrates the testing cycles for the lamps. To initiate testing, as indicated at step 500, all exterior lamps are turned off, the key is in the ignition and moved to the ON position, the park brake is set and the exterior lamp check switch 24 is pressed. This set of preconditions for execution of the test program should prevent accidental initiation of the program, for example, when the vehicle is being driven. The test routine is divided into three subroutines 510, 520, 540, which are associated with different groups of lights, organized logically by function to assist the operator in his visual inspection walk around. Each subroutine may be programmed to execute repetitively for a predetermined time period, for example two minutes, with each light energization step lasting a few seconds, before the next subroutine is executed. Or, the three subroutines may be programmed to execute in parallel.

Subroutine 510 handles marker and signaling lights. At step 511 the left and right turn signals, marker lights and stop lights are energized. Next, following a one second delay (step 512), a subset of these lights, including the left and right turn signal lights and the stop lights are turned off (step 513). Following a further one second delay (step 514) the marker lights are turned off (step 515). Then, yet another one second delay is executed (step 516) and the subroutine returns to step 510.

Subroutine 520 handles the pupil warning light (PWL) group. At step 521 the left red PWLS are turned on and the right red PWLS are turned off. A one second delay (step 522) is then executed. Next, at step 523, the left amber PWLS are turned on and the left red PWLS are turned off. Again a one second delay is executed (step 524). Then, at step 525, right amber PWLS are turned on and the left amber PWLS are turned off. Following a one second delay (step 526) step 527 is executed to turn on the right red PWLS and to turn off the right amber PWLS. Then a one second delay is executed at step 528 and execution is returned to step 521.

Subroutine 540 relates to the light group associated with aiding the driver's sight, i.e. the headlights, foglights and backup lights. Step 541 provides for turning on the high-beams and turning off the lowbeams, fog lamps and back up lights. Step 542 is a three second delay, followed by step 543 where the lowbeams, fog lamps and back up lights are illuminated and the high beams are extinguished. Step 544 provides for another three second delay and execution is returned to step 541.

Step 550 is applicable to all three subroutines and provides for disengagement of the subroutines. Upon occurrence of any of four events the routines cease execution, including, press and release of the brake pedal, release of the park brake, turning the ignition key to the off or crank positions, or manually turning on any light in the test sequences. Automatic disengagement assures that the light sequence will turn off when the driver begins driving the vehicle. In addition, the routine may be exited by turning the process off using switch 24.

Each subroutine defines a group of lamp sets. A unique pattern of illumination and extinguishment of lamps characterizes each group, making the task of remembering which functional sets of lamps belong to each group, and better assuring that an operator does not miss one of the functional sets during walk-around of the vehicle. Patterns are marked by varying when sets are turned on and off with respect to one another from set to set and by varying the delays built into the cycling program for each group. The number of functional sets in each group is limited to four.

The invention provides for simplification of operator inspection of vehicle exterior lamps by through the automatic, sequential and repeated illumination and extinguishment of lamps. Sets of lamps are associated with one another into groups to present an easily recalled hierarchy to the user, and eliminating the need to remember overly complex patters.

While the invention is shown in only one of its forms, it is not thus limited but is susceptible to various changes and modifications without departing from the spirit and scope of the invention.

What is claimed is:

1. A vehicle lighting system comprising:
   a plurality of lamps mounted to be visible on the exterior of the vehicle;
   functional subsets of lamps within the plurality of lamps;
   an electrical system controller having a plurality of lamp energization output ports;
   an energization circuit for each functional subset of lamps, each energization circuit being connected to a different one of the lamp energization output ports;
   a first set of lamp activation switches for functional subsets of lamps, and service brake position and parking brake position switches, connected to the electrical system controller to provide status inputs to the electrical system controller;
   a gauge controller;
   a second set of lamp activation switches, including a lamp test switch, connected to provide status inputs to the gauge controller;
   an ignition switch position sensing element providing a control input to the gauge controller;
   a datalink between the gauge controller and the electrical system controller allowing indication of the state of status and control inputs received by the gauge controller to be communicated to the electrical system controller;
   the electrical system controller further including a programmable microcomputer for switching on and off each of the plurality of lamp energization output ports; and
   a test program executable on the programmable microcomputer and responsive to actuation of the lamp test switch for execution, the test program including program means for associating selected functional subsets of lamps into a plurality of exclusive groups, and providing further program means for allowing selection of at least a first exclusive group for sequential actuation and extinguishment of the lamps of each selected exclusive group undergoing testing by energization of the lamp energization output ports.

2. A vehicle lighting system as claimed in claim 1, the test program further comprising:
   means responsive to detection that the park brake is set, the ignition switch position is on and all exterior lamp energization output ports are off for allowing the test program to proceed upon detection of activation of the exterior lamp check switch.

3. A vehicle lighting system as claimed in claim 2, the test program further comprising;
   program means for detecting a change in state of one of the brake position switch, the park brake position switch, or a lamp activation switch for terminating execution of the test program.

4. A vehicle lighting system as claimed in claim 1, wherein no exclusive group includes more than four functional subsets of lamps and the test program is responsive to selection of more than one exclusive group for testing for executing the sequential energization of the lamps of the selected exclusive groups in parallel.

5. A vehicle lighting system as claimed in claim 4, the program means providing sequences for each exclusive group which follow mutually distinguishable, predetermined patterns which provide a length of time that each set of lamps is on and extinguished each cycle as part of the predetermined pattern identified with each exclusive group.

6. A method of automated lamp exercise for a motor vehicle to assist in visual inspection of the operational status of the lamps, the method comprising the steps of:
   establishing a plurality of mutually exclusive groups of lamps where lamps in an exclusive group are related by operational function and where each group includes at least one lamp;
   defining a pattern of on and off illumination of the lamps and delays between illumination of lamps within a group for each of the plurality of groups making the pattern for each group visually identifiable to an observer upon execution;
   responsive to user request for lamp exercise determining the status of the vehicle service brake, the vehicle park brake and the on/off status of the lamps to be exercised;
   responsive to the vehicle service brake being open, the vehicle park brake being set and the lamps being off, initiating a repeating cycle of energization for at least a first group of lamps; and
   interrupting lamp exercise responsive to activation of the vehicle service brake, release of the park brake or turning on any of the lamps being exercised.

7. A vehicle lighting system as claimed in claim 1, the test program further comprising:
   the means for allowing selection providing a distinct pattern of illumination and extinguishment for the members of each group which allows the groups to be visually identified by an observer including when running concurrently.

\* \* \* \* \*